United States Patent
Tauchi et al.

(10) Patent No.: US 6,837,937 B2
(45) Date of Patent: Jan. 4, 2005

(54) PLASMA PROCESSING APPARATUS

(75) Inventors: Susumu Tauchi, Tokuyama (JP);
Masanori Kadotani, Kudamatsu (JP);
Muneo Furuse, Kudamatsu (JP);
Motohiko Yoshigai, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/228,048

(22) Filed: Aug. 27, 2002

(65) Prior Publication Data

US 2004/0040507 A1 Mar. 4, 2004

(51) Int. Cl.⁷ .......................... C23C 16/00; H05H 1/00
(52) U.S. Cl. .................. 118/715; 156/345.28
(58) Field of Search .............. 118/715; 156/345.28, 156/345.24

(56) References Cited

U.S. PATENT DOCUMENTS 5,672,541 A * 9/1997 Booske et al. .............. 438/513
6,297,594 B1 * 10/2001 Sakai et al. ............. 315/111.41
2002/0020499 A1 * 2/2002 Collins et al. .............. 156/345

FOREIGN PATENT DOCUMENTS

| JP | 11-003883 | 1/1999 |
| JP | 11-008225 | 1/1999 |
| JP | 2000-072529 | 3/2000 |
| JP | 2001-319966 | 11/2001 |

* cited by examiner

Primary Examiner—Parviz Hassanzadeh
(74) Attorney, Agent, or Firm—Antonelli, Terry, Stout & Kraus, LLP

(57) ABSTRACT

It is required for the conventional plasma processing apparatus used for plasma processing in a reduced pressure atmosphere to replace the component parts such as earth member frequently as the expendable supplies because an insulation-processed layer and the substrate itself are thinned due to plasma and impurities contained in these thinned materials diffuse into plasma to result in adverse effect on a sample such as wafer, and thinning of the insulation-processed layer due to plasma and resultant electrical effect of the thinning of the insulation-processed layer cause the change of the state of plasma. The invention solves the problem by using electrically conductive ceramic that is formed of a baked material mainly composed of alumina for component parts of the apparatus in the plasma processing apparatus used for plasma processing of an sample to be processed such as wafer in a reduced pressure atmosphere.

10 Claims, 4 Drawing Sheets

PLASMA PROCESSING APPARATUS

BACKGROUND OF THE INVENTION

1. Field of the Invention

This invention relates to a plasma processing apparatus used for processing of a sample such as wafer by use of plasma in a reduced pressure atmosphere.

2. Related Background Art

For example, conventional plasma processing apparatus for processing a sample such as wafer by use of plasma in a reduced pressure atmosphere are disclosed in JP-A (Unexamined patent publication) No. H9-7988 and JP-A No. H11-330044. These inventions describe insulation processing on the surface or inner wall of component parts such as grounding member in a chamber. In detail, the insulation processing with aluminum-alumite is applied on an grounding surface of the conductive grounding member consisting of aluminum alloy. In other words, a ring provided on the outside of a sample table in a processing chamber that is used for grounding consists of conductive grounding material, and the insulation processing is applied on the surface. An alumite film is formed on the surface of the ring consisting of aluminum alloy by means of anodizing technique.

Furthermore, JP-A No. H8-250469 proposes a technique in which carbon silicate (SiC) is used for grounding.

The above-mentioned conventional techniques insufficiently address the surface thinning of the insulation-processed layer due to etching gas or plasma. In detail, the thinning of the insulation-processed layer and substrate itself due to plasma causes diffusion of impurities contained in the material and the diffusion adversely affects the quality of a wafer sample. The thinning of the insulation-processed layer due to plasma affects electrically to thereby change the state of the plasma. Since components such as grounding member are exposed to plasma, the components should be inevitably replaced frequently as expendable components, in the conventional plasma processing apparatus.

In detail, because an alumite film on the ring surface is as thin as 10 to 50 μm, the alumite film is thinned gradually during exposing to plasma, and finally aluminum alloy, which is mother material of the ring, is exposed to plasma. If aluminum alloy is exposed continuously, the exposure adversely affects the plasma electrically, and the ring is thinned faster than alumite film because the ring is less corrosion resistant than alumite film. The exposure causes diffusion of impurities and aluminum itself as foreign matter in plasma, and adversely affects devices. To avoid such problem, when an alumite film is thinned exhaustively, it is required to replace the thinned ring with a new ring immediately, because the ring is expendable.

Furthermore, even though ceramic such as carbon silicate (SiC) that is resistant to plasma is used as component parts, the life is short, and it is required to replace it frequently. The reason is that silicon (Si) and carbon (C) that are used as the material of the component parts are materials that are accessible to thinning due to plasma for wafer processing, and that are accessible to chemical reaction due to exposure to plasma.

SUMMARY OF THE INVENTION

It is an object of the present invention to provide a plasma processing apparatus having a processing chamber structure that is inaccessible to plasma for stable processing performance.

It is another object of the present invention to provide a plasma processing apparatus in which expendable supplies are not required to be replaced frequently.

To solve the problem, the present invention provides a plasma processing apparatus for processing a sample with plasma in a reduced pressure atmosphere, wherein electrically conductive ceramic formed of a baked material mainly composed of alumina is used as the material of at least one component parts that is exposed to the plasma in the processing apparatus.

Thereby, even though the component parts are thinned by plasma, diffusion of impurities into plasma and resultant adverse effect on processing performance of a sample are suppressed. Furthermore, even though the component parts is thinned, the replacement frequency of expendable supplies can be lowered.

DETAILED DESCRIPTION OF THE PREFERRED EMBODIMENTS

Figure 1:
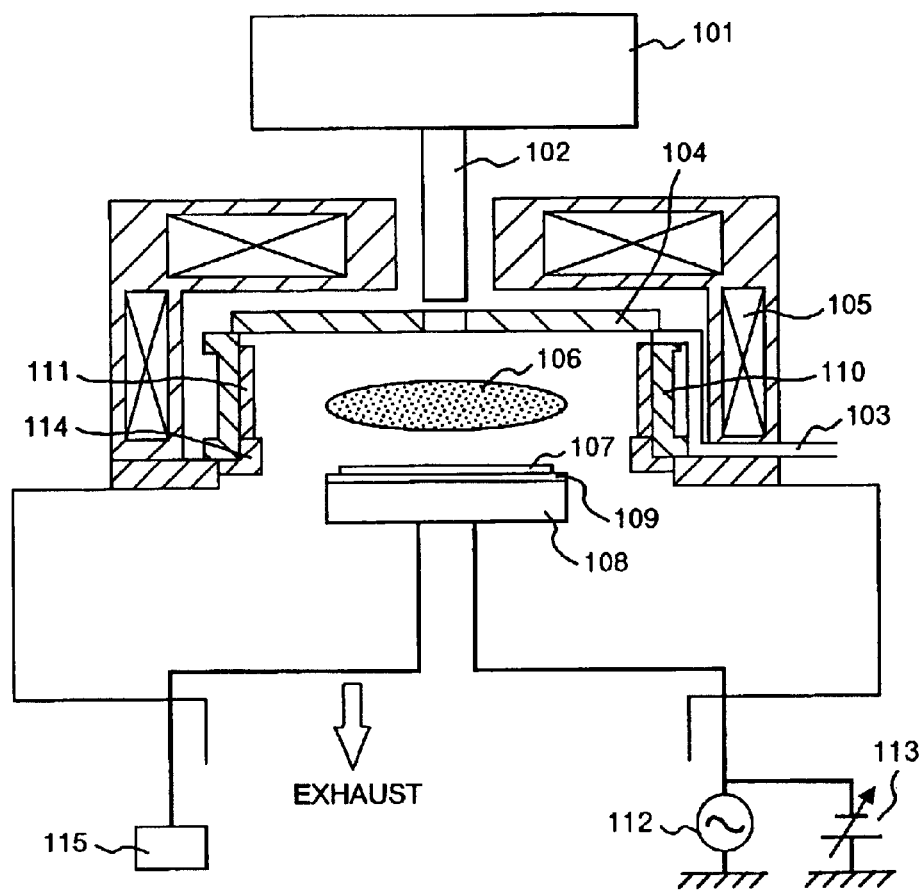
FIG. 1 is a diagram showing the detail of plasma generator of a magnetic field UHF wave etching apparatus in accordance with an embodiment of the present invention.

An embodiment of a plasma processing apparatus to which the present invention is applied, for example, a plasma etching apparatus will be described in detail hereinafter with reference to FIG. 1 and FIG. 2. FIG. 1 is a diagram showing the detail of a plasma generator of a UHF wave etching apparatus with magnetic field. In this embodiment, UHF wave and magnetic field are used as the unit for generating plasma exemplarily. UHF wave is introduced into a processing chamber in a vacuum vessel 110 though a waveguide 102 and radio wave transmission window 104 (for example, quartz flat plate) from the UHF wave power source 101. The vacuum vessel 110 is cylindrical and the inside periphery of the vacuum vessel 110 is covered by a cylinder 111 of quartz or alumina, and a solenoid coil 105 that generates a magnetic field is provided on the outside of the cylinder 111. Processing gas is introduced into the processing chamber in the vacuum vessel 110 from a gas pipe 103. The gas, magnetic field, and UHF wave are used synergistically to generate plasma 106 in the processing chamber of the vacuum vessel 110. A static absorption film 109 is provided on a sample table 108 on which a sample 107 is placed. The static electricity is absorbed from the sample 107 by applying a DC voltage on the sample table 108 from a DC power source 113.

A high frequency power source 112 that supplies high frequency power continuously or periodically (ON/OFF) is connected to the sample table 108. Furthermore, a coolant temperature controller 115 for controlling the temperature of circulated coolant to adjust the temperature of the sample table is connected to the sample table 108. A electrically conductive ceramic ring 117 that functions to earth the plasma 106 is provided on the outside of the sample table 108 in the vacuum vessel 110.

In the present invention, by using an electrically conductive ceramic ring 117 that is more resistant to thinning due to plasma or more non-reactive to plasma, or by using an electrically conductive ceramic ring 117 that adversely affects the sample less significantly even though the ring 117 is thinned or reacted, the problem of the conventional techniques is solved. The electrically conductive ceramic ring mainly consists of aluminum oxide ($Al_2O_3$) and manufactured by baking. In detail, the material of the electrically conductive ceramic ring 117 is composed of 99.0% to 99.6% of alumina, 0.4% to 1.0% of carbon (C), and 0.1% or less of impurities. The contents of impurity iron (Fe), nickel (Ni), chromium (Cr), cobalt (Co), are sodium (Na) are 20 ppm or less respectively.

The electric resistance value of the electrically conductive ceramic to be used in the present embodiment ranges from 0.1 Ω·cm to 100 Ω·cm.

It is preferable that the electrically conductive ceramic ring 117 is provided with a conductive cushion at the contact point with the vacuum vessel 110 so that the electrically conductive ceramic ring 117 is earthed through the vacuum vessel 110. Because the electrically conductive ceramic ring 117 not only has excellent conductivity that is the characteristic of the grounding material but also has excellent corrosion resistance equivalent to that of an alumite film, the plasma is not adversely affected even though the electrically conductive ceramic ring is thinned. Therefore, the electrically conductive ceramic ring 117 can be used up to the mechanical strength limit until the configuration cannot be maintained.

The relation between ceramic materials that are likely used as the component parts exposed to plasma in the processing apparatus and properties of these materials is listed in Table 1.

TABLE 1

COMPARISON BETWEEN CERAMIC TYPE AND CHARACTERISTICS

| Ceramic type | Composition | Conductivity (note 1) | corrosion resistance | suppression of foreign matter | Life |
|---|---|---|---|---|---|
| Alumina + 0.4% C (note 2) | $Al_2O_3$, C | ◯ | ◯ | ◯ | ◯ |
| Titania | $TiO_2$ | ◯ | ◯ | X | ◯ |
| SiC | SiC | ◯ | X | ◯ | X |
| Alumite (note 3) | $Al_2O_3$ | ◯ | ◯ | Δ | X |

◯ = good
Δ = not bad
X = poor
(note 1):
reaction with etching gas.
(note 2):
Alumina + 0.4% C contains alumina of 99.5%, C of 0.4%, and impurity of less than 0.1%.
(note 3):
Alumite contains trace amount of Mg, Fe, Cr, and Cu.

Figure 2:
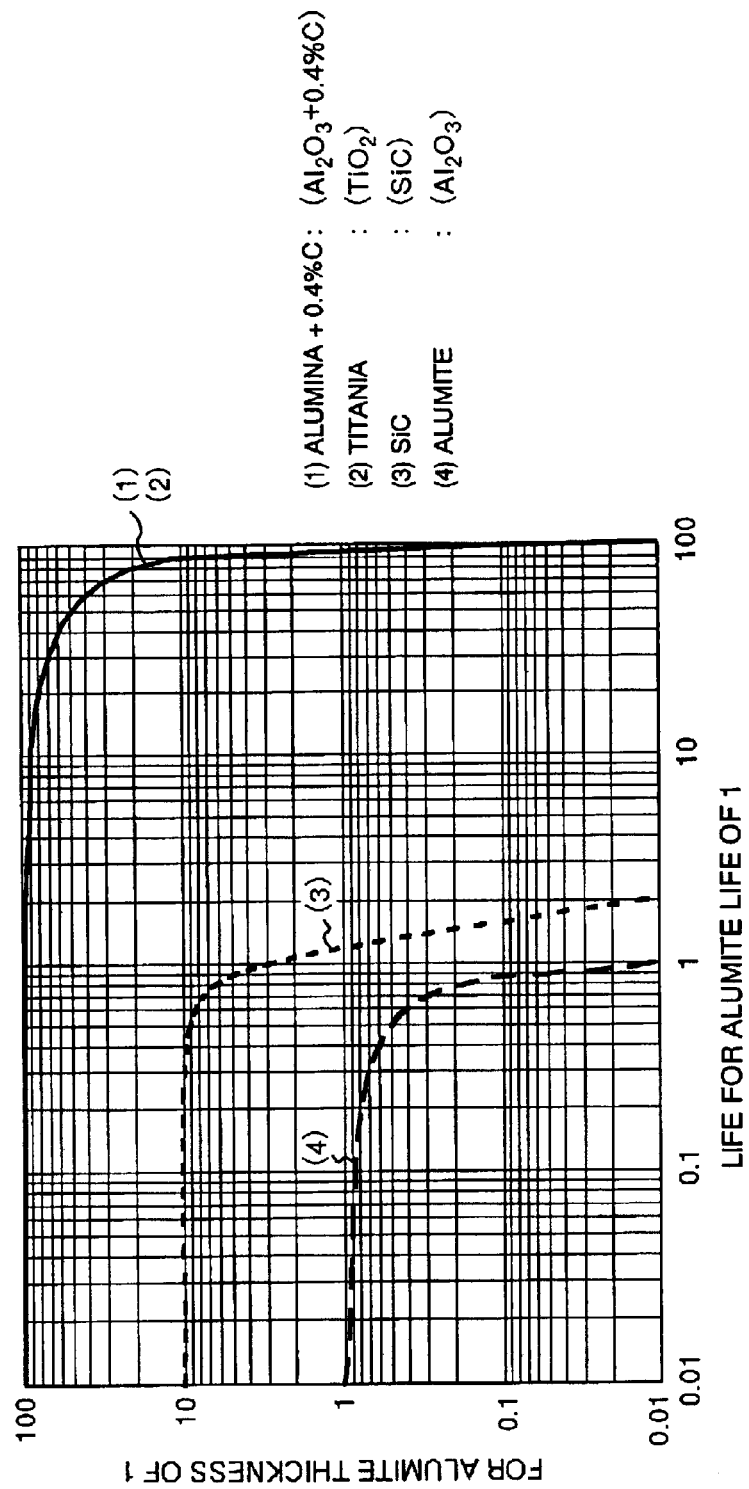
FIG. 2 is a diagram showing the relation between ceramic materials that are likely used for component parts that are exposed to plasma in a processing apparatus and properties of the materials.

FIG. 2 shows the relation between the practical initial thickness of ceramic materials that is represented relatively based on the alumite thickness of 1 and the life, namely, the relation between plasma processing time and thinned value.

It is found from Table 1 and FIG. 2 that Ti is diffused into plasma from titania as foreign matter to thereby cause adverse effect on the sample such as device failure. SiC is a material that is susceptible to thinning due to plasma used for wafer processing and susceptible to chemical reaction due to exposure to plasma. Therefore, SiC is poor in corrosion resistance and life. The life of SiC is approximately 1/10 of the electrically conductive ceramic having the same thickness. Alumite is poor in life and suppression of foreign matter because the initial thickness is inevitably thin as described hereinbefore.

On the other hand, it is found that the electrically conductive ceramic used in the embodiment is excellent in conductivity, corrosion resistance, foreign matter suppression, and life.

The position of the earth is by no means limited to the outside of the sample table 108, and the earth may be located anywhere as long as the earth is in contact with the plasma 106 in the vacuum vessel 110 and the sample can be transferred without trouble. However, the space under the sample table 108 is not desirable as the earth position because the plasma 106 is not distributed.

Figure 3:
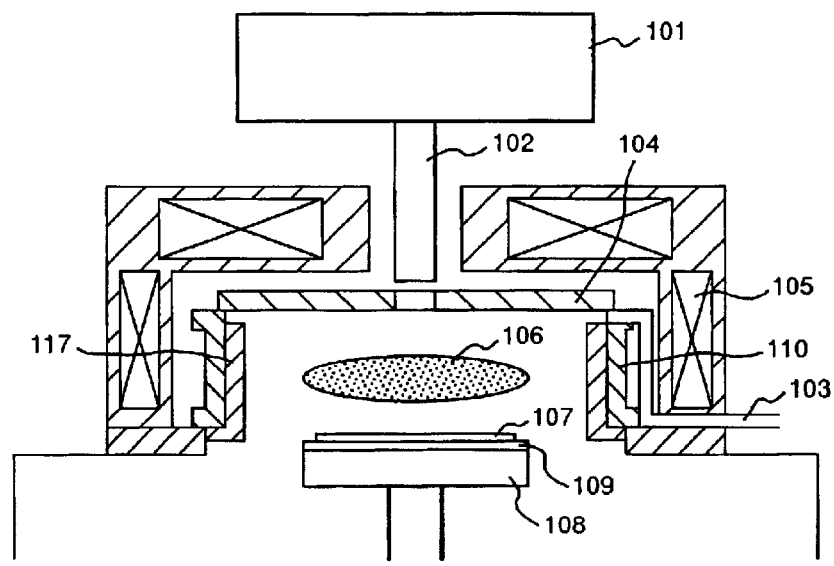
FIG. 3 is a diagram showing the detail of a plasma generator of a magnetic field UHF wave etching apparatus in accordance with another embodiment of the present invention.

Next, FIG. 3 shows another embodiment of the present invention in which an inner cylinder (cylinder 111 in FIG. 1) of the vacuum vessel 110 and a ring 117 are fabricated combinedly as an electrically conductive ceramic ring 117B. The cylinder 111 is provided to protect the inner wall of the vacuum vessel 110, and the ring 117 is used to earth the plasma. By fabricating the inner cylinder and the earth ring combinedly as the electrically conductive ceramic ring 117B, the number of parts of the whole apparatus can be reduced while corrosion resistance to plasma and conductivity required for grounding material are secured.

The ring that functions as the earth is addressed as the component parts that is exposed to plasma, however, component parts that are exposed to plasma other than the earth, for example, a part of the inner wall of the vacuum vessel 110 may be composed of the electrically conductive ceramic.

This embodiment may be applied to processing apparatus other than the magnetic field UHF wave etching type apparatus, for example, may be applied to a parallel flat plate type RIE apparatus. The parallel flat plate type RIE apparatus is different from the magnetic field UHF wave etching apparatus in that an earthed top electrode that is facing to the sample table 108 is provided and a high frequency wave is applied from a bias applying high frequency power source between the electrodes to generate plasma instead of plasma generated by interaction between UHF wave and magnetic field of the solenoid. This embodiment is different from the above-mentioned embodiment only in the plasma generating technique, and the electrically conductive ceramic parts may be employed as the component parts that are exposed to plasma.

Figure 4:
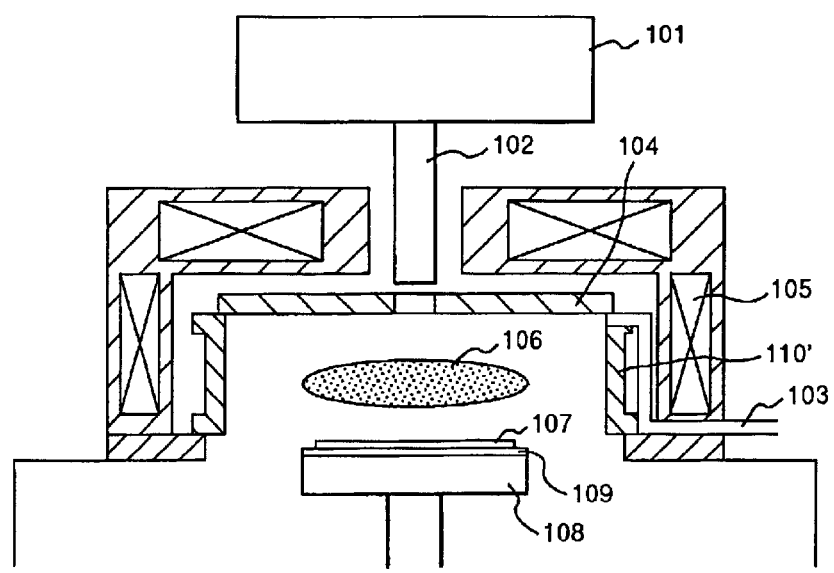
FIG. 4 is a diagram showing the detail of a plasma generator of a magnetic field UHF wave etching apparatus in accordance with further another embodiment of the present invention.

FIG. 4 shows another embodiment of the present invention in which the whole cylindrical sidewall of the vacuum vessel 110' is composed of electrically conductive ceramic. The whole cylindrical sidewall of the vacuum vessel 110' composed of electrically conductive ceramic brings about corrosion resistance to the plasma while the mechanical strength is maintained and it can be used as the earth. Therefore, the cylinder 111 and the ring 114 used in the embodiment shown in FIG. 1 are eliminated, and the number of parts can be reduced.

Figure 5:
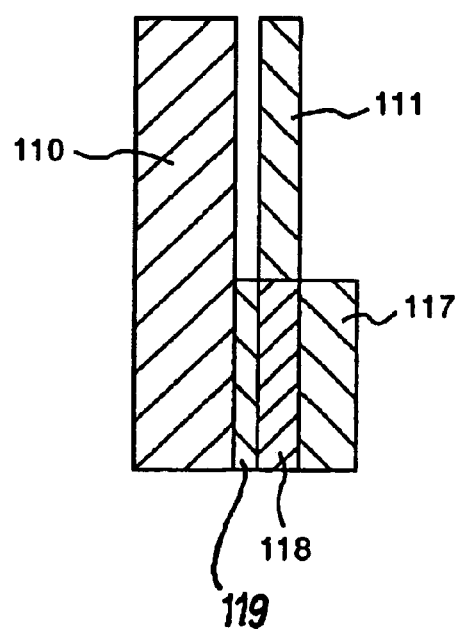
FIG. 5 is a diagram showing the detail of an grounding member in accordance with another embodiment of the present invention.

Furthermore, another embodiment of the present invention will be described with reference to FIG. 5. In this embodiment, an electrically conductive or non-conductive ceramic that is served as a core member 119 is provided combinedly in the inside of the electrically conductive ceramic-made ring 118 that is served as the grounding member. The core member 119 is composed of a material that is sufficiently strong mechanically for supporting the cylinder 111 consisting of quartz or alumina. In the case of this embodiment, the grounding member may be replaced when the ring 118 is almost thinned and just before the core member 119 is exposed. Thereby, the plasma is not adversely affected and the cylinder 111 can be supported even though the electrically conductive ceramic-made ring 118 is thinned.

The present invention may be applied to other plasma processing apparatus such as CVD apparatus, sputtering apparatus, ashing apparatus, and ion implantation apparatus that use plasma in addition to the plasma etching apparatus.

As described hereinabove, according to the embodiments of the present invention, because the life of component parts is long, the present invention provides the stable plasma processing apparatus that requires replacement of component parts less frequently. In detail, diffusion of impurities into plasma is suppressed even though the plasma thins down the component parts. As the result, a stable plasma apparatus is provided. Furthermore, frequency of replacement of expendable supplies may be lowered because thinning of the component parts does not adversely affect the apparatus electrically even though the component parts is thinned.

What is claimed is:

1. A plasma processing apparatus for processing a sample with plasma in a processing chamber of reduced pressure atmosphere, comprising:

at least one component part, exposed to the plasma inside the processing chamber, formed of a baked material mainly composed of alumina and an electrically conductive material, wherein said component part serves to earth the plasma.

2. A plasma processing apparatus for processing a sample with plasma in a processing chamber of reduced pressure atmosphere having a ring that is served to earth the plasma in the processing chamber, wherein said ring is comprised of a part formed of a baked material mainly composed of alumina and electrically conductive material.

3. A plasma processing apparatus for processing a sample with plasma in a processing chamber of reduced pressure atmosphere having an inner cylinder provided for protecting the inner wall of the processing chamber, wherein said inner cylinder is comprised of a part formed of a baked material mainly composed of alumina and an electrically conductive material and also serves to earth the plasma.

4. The plasma processing apparatus as claimed in any one of claim 1 to claim 3, wherein the part contains 99.0% to 99.6% of alumina and 0.4% to 1.0% of carbon (C).

5. The plasma processing apparatus as claimed in claim 4, wherein the part contains iron (Fe), nickel (Ni), chromium (Cr), cobalt (Co), and sodium (Na) in an amount of 20 ppm or less respectively as the impurity.

6. The plasma processing apparatus as claimed in claim 4, wherein the part contains 0.1% or less of impurities.

7. The plasma processing apparatus as claimed in any one of claim 1 to claim 3, wherein the electric resistance value of the part ranges from 0.1 Ω·cm to 100 Ω·cm.

8. The plasma processing apparatus as claimed in claim 1, wherein the part mainly composed of alumina and an electrically conductive material is used as the material of the whole side wall of the processing chamber.

9. The plasma processing apparatus as claimed in claim 2, wherein a sample table is provided in said processing chamber, and wherein said ring is disposed on the outside of said sample table in said processing chamber.

10. The plasma processing apparatus as claimed in claim 2, wherein said ring serves to earth the plasma through the inner wall of the processing chamber.

* * * * *